United States Patent
Dorfman

(10) Patent No.: US 8,704,087 B2
(45) Date of Patent: Apr. 22, 2014

(54) SOLDERABLE POLYMER THICK FILM CONDUCTIVE ELECTRODE COMPOSITION FOR USE IN THIN-FILM PHOTOVOLTAIC CELLS AND OTHER APPLICATIONS

(75) Inventor: Jay Robert Dorfman, Durham, NC (US)

(73) Assignee: E I du Pont de Nemours and Company, Wilmington, DE (US)

( * ) Notice: Subject to any disclaimer, the term of this patent is extended or adjusted under 35 U.S.C. 154(b) by 98 days.

(21) Appl. No.: 13/150,648

(22) Filed: Jun. 1, 2011

(65) Prior Publication Data

US 2012/0305065 A1    Dec. 6, 2012

(51) Int. Cl.
*H01L 31/0224* (2006.01)
*H01L 31/0216* (2006.01)

(52) U.S. Cl.
USPC ............. 136/256; 136/252; 438/660; 438/98; 252/514; 252/511; 252/512; 257/E21.211; 257/E31.124

(58) Field of Classification Search
USPC ............. 136/256, 252; 438/660, 98; 252/514, 252/511, 512; 257/E21.111, E31.124
See application file for complete search history.

(56) References Cited

U.S. PATENT DOCUMENTS

| | | | |
|---|---|---|---|
| 5,049,313 A | | 9/1991 | Frentzel |
| 5,089,173 A | | 2/1992 | Frentzel et al. |
| 5,242,623 A | * | 9/1993 | Morrison, Jr. ............ 252/512 |
| 5,283,007 A | * | 2/1994 | Yamamoto et al. ...... 252/519.32 |
| 5,470,643 A | * | 11/1995 | Dorfman .................. 428/206 |
| 5,728,230 A | * | 3/1998 | Komori et al. ............ 136/251 |
| 5,855,820 A | | 1/1999 | Chan et al. |
| 6,228,288 B1 | | 5/2001 | Chacko |
| 6,706,961 B2 | * | 3/2004 | Shimizu et al. ........... 136/256 |
| 2006/0145125 A1 | | 7/2006 | Kuwajima et al. |
| 2007/0164260 A1 | | 7/2007 | Kuwajima |
| 2009/0101199 A1 | * | 4/2009 | Carroll et al. ............. 136/252 |
| 2010/0021625 A1 | | 1/2010 | Dorfman |
| 2011/0180137 A1 | * | 7/2011 | Iwamuro et al. ........... 136/256 |

FOREIGN PATENT DOCUMENTS

EP    0 169 060 A2    1/1986

OTHER PUBLICATIONS

"Thin Film Silicon Solar Cells", Accessed from http://catalogue.polytechnique.fr/site.php?id=472&fileid=3576 on Nov. 18, 2013.*

* cited by examiner

*Primary Examiner* — Golam Mowla

(57) ABSTRACT

The invention is directed to a polymer thick film conductive composition comprising (a) a conductive silver-coated copper powder; and (b) an organic medium comprising two different resins and organic solvent, wherein the ratio of the weight of the conductive silver-coated copper powder to the total weight of the two different resins is between 5:1 and 45:1.

The invention is further directed to a method of electrode grid and/or bus bar formation on thin-film photovoltaic cells using the composition and to cells formed from the method and the composition.

6 Claims, No Drawings

SOLDERABLE POLYMER THICK FILM CONDUCTIVE ELECTRODE COMPOSITION FOR USE IN THIN-FILM PHOTOVOLTAIC CELLS AND OTHER APPLICATIONS

FIELD OF THE INVENTION

The invention is directed to a solderable polymer thick film (PTF) silver-coated copper conductive composition for use in thin-film photovoltaic cells. In one embodiment, the PTF conductive composition is used as a screen-printed grid/bus bar on top of a transparent conductive oxide (TCO) such as indium tin oxide.

TECHNICAL BACKGROUND OF THE INVENTION

Thin-film photovoltaic (PV) cells are usually characterized by a light-absorbing semiconductor such as amorphous silicon, copper indium gallium diselenide (CIGS), or cadmium telluride. This distinguishes them from the traditional crystalline silicon-based PV cells. Thin-film refers to the thickness of the semiconductor which is typically about 2 microns for the thin-film cells as opposed to 30-50 microns for crystalline silicon (c-silicon) cells. Another difference between thin-film and c-silicon PV cells is the temperature limitations involved. Thin-film cells must be processed at less than 200° C. as the semiconductor and/or the substrate used in thin-film cannot withstand high temperatures. The traditional c-silicon PV cells may be processed at temperatures up to 800° C. Thus, the use of a polymer thick film (PTF) conductive composition as the front-side (sun side) electrode grid/bus bar is required. PTF compositions themselves are only stable up to approximately 200° C. Additionally, PTF compositions usually do not lend themselves to soldering as this is done at temperatures of 200 to 260° C. Further, most, if not all current PTF electrode compositions do not wet well with solder and do not possess good adhesion to the solar cell after soldering.

It is therefore a primary objective of this invention to produce a solderable PTF conductive composition which adheres to the underlying substrate with reasonable adhesion even after soldering.

SUMMARY OF THE INVENTION

The invention relates to a solderable polymer thick film conductive composition comprising:
(a) a conductive silver-coated copper powder; and
(b) an organic medium comprising two different resins and organic solvent,
wherein the ratio of the weight of the conductive silver-coated copper powder to the total weight of the two different resins is between 5:1 and 45:1.

In one embodiment, the two different resins are a phenoxy resin and a phenolic resin Based on the total weight of the composition, the silver-coated copper powder is 60 to 93 weight percent, the total weight of the two resins is 2 to 12 weight percent and the organic medium is 7 to 40 weight percent of the solderable polymer thick film conductive composition The composition may be processed at a time and temperature necessary to remove all solvent.

The invention is further directed to a method of electrode grid and/or bus bar formation on thin-film photovoltaic cells using the composition and to cells formed from the method and the composition.

DETAILED DESCRIPTION OF INVENTION

The invention relates to a solderable polymer thick film conductive composition for use in thin-film photovoltaic cells. It is typically used to improve the electrical efficiency of the cells and to make connection to the cell through soldering. A grid-like pattern and/or bus bars of the solderable polymer thick film conductive composition can be printed on top of a transparent conductive oxide.

Generally, a thick film composition comprises a functional phase that imparts appropriate electrically functional properties to the composition. The functional phase comprises electrically functional powders dispersed in an organic medium that acts as a carrier for the functional phase. The organic medium typically comprises polymer resin and an organic solvent. Generally, the composition is fired to burn out the organics and to impart the electrically functional properties. However, in the case of a polymer thick film, the polymer resin remains as an integral part of the composition after drying. Prior to firing, a processing requirement may include an optional heat treatment such as drying, curing, reflow, and others known to those skilled in the art of thick film technology.

The main components of the instant thick film conductive composition are a conductive powder dispersed in an organic medium, which includes two different polymer resins and solvent.

A. Conductive Powder

The conductive powder in the present thick film composition is a conductive silver-coated copper powder.

The silver-coated copper powder is a flake-like structure with an average particle size of approximately 3 microns. The percentage silver is approximately 10%. The preferred silver-coated copper is Silver-Coated Copper Flake 0204 available from Ferro Inc., Columbus, Ohio. The particle size is 2-4 microns.

In one embodiment, the silver-coated copper is present at 60 to 93 wt % of the total weight of the composition. In another embodiment, the silver-coated copper is present at 75 to 93 wt % of the total weight of the composition. In still another embodiment, the silver-coated copper is present at 85 to 92 wt % of the total weight of the composition.

B. Organic Medium

The powders are typically mixed with an organic medium, i.e. an organic vehicle, by mechanical mixing to form a pastelike composition, called "paste", having suitable consistency and rheology for printing. The organic medium is comprised of two different resins and an organic solvent.

The organic medium must be one in which the solids are dispersible with an adequate degree of stability. The rheological properties of the medium must be such that they lend good application properties to the composition. Such properties include dispersion of solids with an adequate degree of stability, good application of composition, appropriate viscosity, thixotropy, appropriate wettability of the substrate and the solids, a good drying rate, and a dried film strength sufficient to withstand rough handling.

The polymer resins required include a phenoxy resin, i.e., a polyhydroxyether resin, which allows high weight loading of silver-coated copper and thus helps achieve both good adhesion to indium tin oxide (ITO) substrates and low contact resistivity, two critical properties for conductive electrodes in thin-film photovoltaic cells. The other polymer resin required in this embodiment for high-temperature stability and thus adhesion after soldering is a phenolic resin. In one embodiment, the phenoxy resin is 0.1 to 5.0 wt % of the total weight of the composition. In another embodiment, the phenoxy resin is 0.2 to 4.0 wt % of the total weight of the composition. In still another embodiment, the phenoxy resin is 2.0 to 3.0 wt % of the total weight of the composition. In one embodiment, the phenolic resin is 0.20 to 1.0 weight percent of the total composition. The total weight of the two resins is from 0.3-6 weight percent, based on the total weight of the composition.

Solvents suitable for use in the polymer thick film composition are recognized by one of skill in the art and include acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In one embodiment, the solvent is one or more components selected from the group consisting of: diethylene glycol ethyl ether acetate (carbitol acetate) and butyl carbitol. In addition, volatile liquids for promoting rapid hardening after application on the substrate may be included in the organic vehicle. In many embodiments of the present invention, solvents such as glycol ethers, ketones, esters and other solvents of like boiling points (in the range of 180° C. to 250° C.), and mixtures thereof may be used. The preferred mediums are based on glycol ethers and β-terpineol. Various combinations of these and other solvents are formulated to obtain the viscosity and volatility requirements desired.

Although screen-printing is expected to be a common method for the deposition of polymer thick film conductive compositions, other conventional methods including stencil printing, syringe dispensing or other deposition or coating techniques may be utilized.

In one embodiment, the organic medium is present at 7 to 40 wt % of the total weight of the composition. In another embodiment, the organic medium is present at 7 to 25 wt % of the total weight of the composition. In still another embodiment, the organic medium is present at 8 to 15 wt % of the total weight of the composition.

Application of Thick Films

The polymer thick film conductive composition or "paste" is typically deposited on a substrate, such as sputtered polyester, that is impermeable to gases and moisture. The substrate can also be a sheet of flexible material. The flexible material can be an impermeable plastic such as polyester, e.g. polyethylene terephthalate, or a composite material made up of a combination of plastic sheet with optional metallic or dielectric layers deposited thereupon. In one embodiment, the substrate can be in the form of a thin-film photovoltaic cell, i.e., a build-up of layers with metalized, e.g., stainless steel, polyester followed by the semiconductor layer, e.g., CIGS, followed by a thin CdS layer, followed by sputtered indium tin oxide. The solderable polymer thick film conductive composition is deposited onto the ITO on the front-side of the thin-film photovoltaic cell.

The deposition of the polymer thick film conductive composition is performed preferably by screen printing, although other deposition techniques such as stencil printing, syringe dispensing or coating techniques can be utilized. In the case of screen-printing, the screen mesh size controls the thickness of deposited thick film.

The deposited thick film conductive composition is dried, i.e., the solvent is evaporated, by exposure to heat for typically 15 to 30 min at 180° C., thus forming a thin-film photovoltaic cell with the dried thick film conductive composition on the front-side providing a conductive metallization. After this drying or curing step, a solder ribbon whose composition is typically 62/36/2 Sn/Pb/Ag is attached to the printed conductive metallization with a soldering gun heated to approximately 270° C.

EXAMPLE

The present invention will be discussed in further detail by giving a practical example. The scope of the present invention, however, is not limited in any way by this practical example.

Adhesion to alumina was measured using an ASTM Tape method. A 600 grade tape was applied to a printed/dried pattern of PTF conductive composition. The tape was removed in a continuous fashion and the amount of conductive material removed was estimated based upon an arbitrary scale of 1 to 5 with 5 representing no material removal, i.e. excellent adhesion.

Example 1

Comparative Experiments A & B

The PTF silver-coated copper electrode paste was prepared by mixing Silver-Coated Copper Flake 0204 (obtained from Ferro Corp., Columbus, Ohio) with an organic medium composed of polyhydroxyether resin, i.e., phenoxy resin (available from Phenoxy Associates, Inc) and phenolic resin (available from Georgia Pacific). The molecular weights of the resins were approximately 20,000. Solvent was used to dissolve the resins completely prior to adding the silver-coated copper. The solvent was carbitol acetate (available from Eastman Chemical).

The composition of the polymer thick film conductive composition of Example 1 was 87.25 wt % silver-coated copper flakes, 10.78 wt % organic medium, and 1.97 wt % added organic solvent. The organic medium contained 2.45 wt % phenoxy resin, 0.39 wt % phenolic resin and 7.94 wt % solvent. All wt % were based on the total weight of the composition.

This composition was mixed for 30 minutes on a planetary mixer. The composition was then transferred to a three-roll mill where it was subjected to two passes at 100 and 200 psi. At this point, the composition was used to screen print a conductive grid pattern on top of alumina substrates. Using a 280 mesh stainless steel screen, a series of lines were printed, and the conductive paste was dried at 170° C. for 30 min. in a forced air box oven. The resistivity was then measured as 100 mohm/sq/mil. Soldering with 62/36/2 Sn/Pb/Ag resulted in good wetting and good adhesion to the substrate.

As a comparison, two standard compositions, each containing only one resin, were used in Comparative Experiments A and B. The standard composition used in Comparative Experiment A contained silver flake with an average particle size of 5 μm and a range of particle size of 2 to 12 microns and a polyester resin polyester resin (available from Shell Chemical) but not the two resins used in Example 1. It showed a resistivity of approximately 20 mohm/sq/mil but was observed as having poor adhesion to the substrate after soldering. The standard composition used in Comparative Experiment B contained the same silver flake used in Comparative Experiment A and the phenoxy resin used in Example 1 but not the phenolic resin used in Example 1. It showed a resistivity of approximately 15 mohm/sq/mil but would not solder and showed poor adhesion to the substrate.

The large improvement in solderability and adhesion for the conductive composition of Experiment 1, key properties for thin-film PV conductive compositions, enables it to be used for most applications and improves PV cell efficiency. A summary of the results appears in Table 1

TABLE 1

| Silver Composition | Soldered Adhesion to Alumina | Resistivity |
|---|---|---|
| Comp. Experiment A | 1 (poor) | 20 mohm/sq/mil |
| Comp. Experiment B | 1 (poor) | 15 mohm/sq/mil |
| Example 1 | 5 (excellent) | 100 mohm/sq/mil |

What is claimed is:

1. A solderable polymer thick film conductive composition for forming a solderable polymer thick film electrode with electrode formation temperature less than about 200° C., said solderable polymer thick film conductive composition consisting essentially of:
   (a) a conductive silver-coated copper powder; and
   (b) an organic medium consisting of two different resins and organic solvent,
wherein the ratio of the weight of said conductive silver-coated copper powder to the total weight of said two different resins is between 5:1 and 45:1 and said two different resins are a phenoxy resin and a phenolic resin.

2. A solderable polymer thick film conductive composition for forming a solderable polymer thick film electrode with electrode formation temperature less than about 200° C., said solderable polymer thick film conductive composition consisting essentially of,
   (a) 60 to 93 weight percent silver-coated copper powder;
   (b) 7 to 40 weight percent organic medium consisting of two different resins and organic solvent, wherein the total weight of said two resins is 0.3 to 6 weight percent, wherein said conductive silver-coated copper powder is silver-coated copper flakes, wherein said two different resins are a phenoxy resin and a phenolic resin with 0.1 to 5.0 wt % phenoxy resin and 0.20 to 1.0 wt % phenolic resin and wherein the weight percents are based on the total weight of the solderable polymer thick film conductive composition.

3. The solderable polymer thick film conductive composition of claim 2, wherein, based on the total weight of the composition, said silver-coated copper powder is 75 to 93 weight percent, the total weight of said two resins is 0.3 to 6 weight percent and said organic medium is 7 to 25 weight percent of said solderable polymer thick film conductive composition.

4. A thin-film photovoltaic cell comprising a conductive grid line and/or bus bars comprising the dried composition of claim 1, wherein said dried composition of claim 1 has been dried at a temperature less than about 200° C. to form said conductive grid line and/or bus bars and wherein said resins remain as an integral art of said conductive rid line and/or bus bars.

5. A thin-film photovoltaic cell comprising a conductive grid line and/or bus bars comprising the dried composition of claim 3, wherein said dried composition of claim 3 has been dried at a temperature less than about 200° C. to form said conductive grid line and/or bus bars and wherein said resins remain as an integral part of said conductive grid line and/or bus bars.

6. A thin-film photovoltaic cell comprising a conductive grid line and/or bus bars comprising the dried composition of claim 2, wherein said dried composition of claim 4 has been dried at a temperature less than about 200° C. to form said conductive grid line and/or bus bars and wherein said resins remain as an integral part of said conductive grid line and/or bus bars.

* * * * *

UNITED STATES PATENT AND TRADEMARK OFFICE
CERTIFICATE OF CORRECTION

PATENT NO. : 8,704,087 B2
APPLICATION NO. : 13/150648
DATED : April 22, 2014
INVENTOR(S) : Jay Robert Dorfman It is certified that error appears in the above-identified patent and that said Letters Patent is hereby corrected as shown below:

In the Claims

Column 6, Claim 4, Line 19, change "rid" to read -- grid --.

Column 6, Claim 6, Line 30, change "claim 4" to read -- claim 2 --.

Signed and Sealed this
Fifth Day of August, 2014

Michelle K. Lee
*Deputy Director of the United States Patent and Trademark Office*